(12) United States Patent
Taylor, Jr. et al.

(10) Patent No.: US 6,362,057 B1
(45) Date of Patent: Mar. 26, 2002

(54) METHOD FOR FORMING A SEMICONDUCTOR DEVICE

(75) Inventors: William J. Taylor, Jr., Round Rock; Suresh Venkatesan; Asanga H. Perera, both of Austin, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/426,983

(22) Filed: Oct. 26, 1999

(51) Int. Cl.[7] ............... H01L 21/336; H01L 21/3205
(52) U.S. Cl. .............. 438/286; 438/585; 438/947; 438/587
(58) Field of Search ............... 438/286, 947, 438/585, 587

(56) References Cited

U.S. PATENT DOCUMENTS

| | | | | |
|---|---|---|---|---|
| 4,502,914 A | | 3/1985 | Trumpp et al. | 156/643 |
| 4,838,991 A | * | 6/1989 | Cote et al. | |
| 4,992,387 A | | 2/1991 | Tamura | 437/41 |
| 5,705,414 A | | 1/1998 | Lustig | 437/41 |
| 5,923,981 A | * | 7/1999 | Qian | 438/284 |
| 5,942,787 A | * | 8/1999 | Gardner et al. | 257/408 |
| 6,022,815 A | * | 2/2000 | Doyle et al. | 438/947 |
| 6,121,093 A | * | 9/2000 | Cheng et al. | 438/286 |
| 6,180,502 B1 | * | 1/2001 | Liang | 438/595 |

OTHER PUBLICATIONS

Chen et al., "0.35–μm Asymmetric and Symmeric LDD Device Comparison Using a Reliability/Speed/Power Methodology," IEEE, 3 pgs., (1998).

Cheng et al., Channel Engineering for High Speed Sub–1.0 V Power Supply Deep Sub–micron CMOS, Symposium on VLSI Technology Digest of Technical Papers, pp. 69–70 (1999).

Lundstrom, "Scattering Theory of the Short Channel MOSFET," IEEE, pp. 387–390 (1996).

Dudek, "Lithography–Independent Nanometer Silicon MOSFET's on Insulator," IEEE, pp. 1626–1632 (1996).

* cited by examiner

Primary Examiner—Richard Booth

(57) ABSTRACT

A conductive layer (14) and a dummy feature (16) are formed over a semiconductor substrate (10) doped with a first dopant type. A spacer (42) is then formed adjacent the dummy feature (16) and is used to define a first patterned feature (92). In one embodiment, substrate regions (90) are doped with a second dopant type that is a same dopant type as the first dopant type. In an alternative embodiment, substrate regions (90) are doped with a second dopant type that is opposite the first dopant type. The dummy feature (16) is then removed and remaining portions of the spacer (100) are used to define a gate electrode (120). The substrate (10) is then doped optionally with a third dopant type and then with a fourth dopant type, the third and fourth dopant types being opposite the first dopant type, to form asymmetrically doped source (172) and drain regions (174) in the semiconductor substrate (10).

24 Claims, 6 Drawing Sheets

METHOD FOR FORMING A SEMICONDUCTOR DEVICE

FIELD OF THE INVENTION

The present invention relates to the field of semiconductor device manufacturing and more particularly methods for forming semiconductor devices having asymmetrical dopant profiles.

BACKGROUND OF THE INVENTION

Semiconductor devices such as asymmetric metal oxide semiconductor field effect transistors (MOSFETs) are known in the art to provide performance advantages over their symmetrical double-halo and conventional MOSFET counterparts. Advantages of asymmetric MOSFETS include an ability to produce higher drive current ($I_{dsat}$) and higher transconductance ($g_m$), both of which are desirable MOSFET properties. The higher drive current and transconductance increases the semiconductor device's speed, which correspondingly improves overall device performance.

Conventional methods for forming asymmetric MOSFETs currently include using a combination of critical patterning and implanting processes or using implant techniques that require the use of restrictive layout designs to form asymmetrically doped source or drain regions in the semiconductor device. For example, in one prior art method, the semiconductor device substrate is patterned to selectively expose and implant dopant species into only the source region, thereby forming the asymmetrically doped regions in the semiconductor device. Limitations of this prior art method include the photolithography tool's alignment and patterning capabilities. Patterning and implanting only the source region (and not the drain region) of the semiconductor device requires that the photolithography tool be capable of precisely patterning resist feature openings on only one side of the gate electrode. Because the source and drain regions are separated by a dimension that is effectively only as wide as the gate electrode, any misalignment of the resist feature opening relative to the gate electrode can result in insufficiently implanting the source side or undesirably implanting the drain side of the semiconductor device. This issue becomes even more problematic as the gate electrode's critical dimensions decrease.

In another prior art method, the semiconductor device substrate is tilted and then implanted from directions such that only one side (source side or drain side) of the semiconductor device to receive dopant species. This prior art method is undesirable because the asymmetrically doped regions for all of the semiconductor devices on the substrate must be arranged, during design layout, such that they are all oriented in the same direction. This restricts the layout possibilities that can be used to form the integrated circuit (IC). Furthermore, because the asymmetric implant may be performed while tilting the semiconductor device substrate, the semiconductor device packing density must also be considered when arranging the layout. Additionally, shadowing effects produced by resist features can partially or completely block an implant intended for a region of the semiconductor device substrate.

BRIEF DESCRIPTION OF THE FIGURES

The features and advantages of the present invention will be more clearly understood from the following detailed description taken in conjunction with the accompanying FIGURES where like numerals refer to like and corresponding parts and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE FIGURES

In accordance with an embodiment of the present invention, a conductive layer and a dummy feature are formed over a semiconductor substrate that is doped with a first dopant type. A spacer is then formed adjacent the dummy feature to define a first patterned feature. In one embodiment, substrate regions adjacent the first patterned feature are doped with a second dopant type that is a same dopant type as the first dopant type. In an alternative embodiment, substrate regions are doped with a second dopant type that is opposite the first dopant type. The dummy feature is then removed and remaining portions of the spacer are used to define a gate electrode. The substrate is then doped optionally with a third dopant type and then with a fourth dopant type, the third and fourth dopant types being opposite the first dopant type, to form asymmetrically doped source and drain regions in the semiconductor substrate. An embodiment of the present invention will now be described with reference to the accompanying figures.

Figure 1:
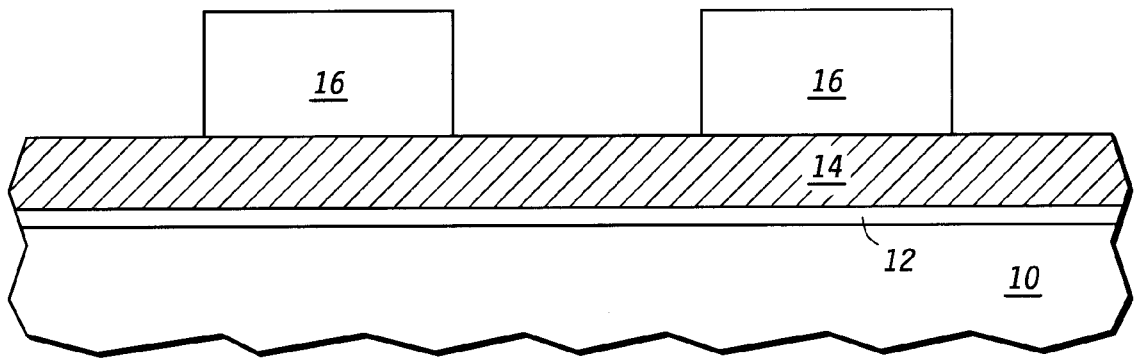
FIGS. 1–2 illustrate, respectively, cross-sectional and top-down views of a semiconductor device substrate that includes dummy features.

Shown in FIG. 1 is a portion of partially processed semiconductor device. The partially processed semiconductor device includes a semiconductor substrate 10, a gate dielectric layer 12, a conductive layer 14, and a dummy feature 16. In accordance with one embodiment, the semiconductor substrate 10 is a monocrystalline silicon substrate. Alternatively the semiconductor substrate 10 can be a semiconductor-on-insulator (SOI) substrate or any other substrate used to form semiconductor devices.

In accordance with one specific embodiment, the substrate 10 is a doped substrate, doped with a first dopant type that includes p-type dopants, such as boron, indium, or the like at a concentration in a range of approximately $5\times10^{15}$ atoms/cm$^3$ to $5\times10^{18}$ atoms/cm$^3$. Alternatively, depending on the specific type of semiconductor device, n-type-dopants, such as phosphorus, arsenic, antimony, or the like can be used. For the purposes of this specification, the dopant type refers generally to any species of dopants from a family of dopants that can be classified as either being p-type (Group IIIA) or n-type (Group IVA)

Shown in FIG. 1, a gate dielectric layer 12 is formed over the substrate 10. In one embodiment, the gate dielectric layer 12 is silicon dioxide formed by thermally oxidizing a portion of semiconductor substrate 10. Alternatively, the gate dielectric layer 12 may be a layer of silicon nitride, a layer of silicon oxynitride, a layer of chemically vapor deposited silicon dioxide, a nitrided oxide layer, a high-k dielectric layer, or a combination thereof. Typically, the thickness of the gate dielectric layer 12 is in a range of approximately 1.5 to 10 nanometers. One of ordinary skill in the art recognizes that a gate dielectric layer is used for forming metal oxide semiconductor field effect transistors (MOSFETs). In other embodiments, including metal semiconductor field effect transistors (MESFETs), the gate dielectric layer 12 may not be necessary.

Overlying the dielectric layer 12 is conductive layer 14. In one embodiment, the conductive layer 14 is a layer of polysilicon. Alternatively, the conductive layer 14 can include a metal layer, such as tungsten or molybedenum, a metal nitride layer, such as titanium nitride or tungsten nitride, or a combination thereof. In addition, the conductive layer 14 can also include a polycide layer comprising a metal silicide layer, such as tungsten silicide, titanium silicide, or cobalt silicide overlying the polysilicon layer. The conductive layer 14 can be formed by methods including, but not limited to chemical vapor deposition or sputter deposition. Typically the thickness of the conductive layer 14 is in a range of approximately 15 to 150 nanometers.

Figure 2:
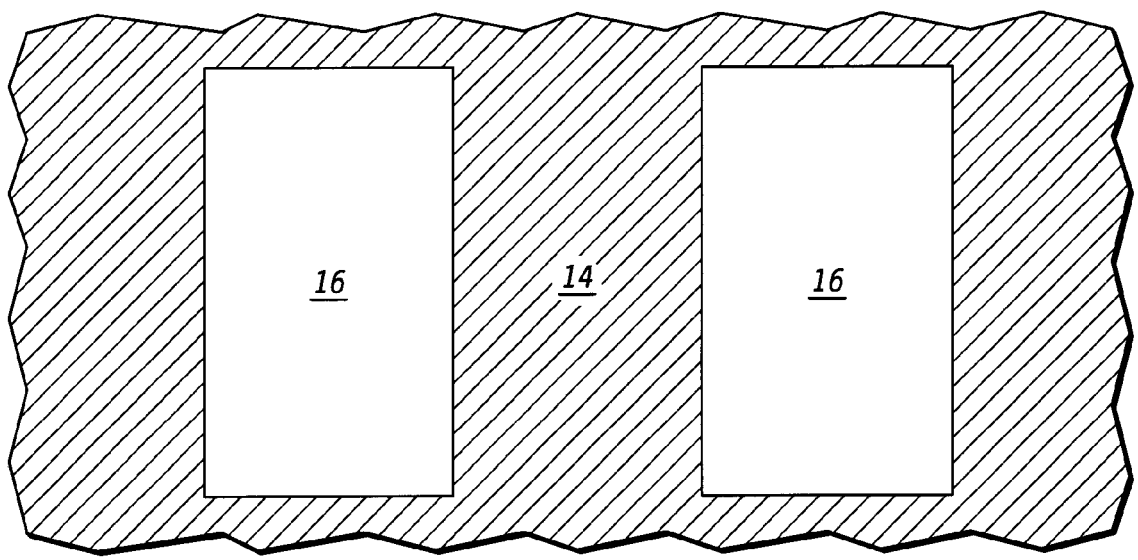

Overlying the conductive layer 14 are dummy features 16, as shown in the cross-section and top-down illustrations of FIG. 1 and FIG. 2, respectively. The dummy features 16 are initially deposited as a blanket layer (dummy layer) overlying the conductive layer 14 and then patterned and etched to form the dummy features 16. In accordance with one embodiment, the blanket layer is a layer of chemically vapor deposited oxide which is formed using tetraethylorthosilicate (TEOS) as a source gas. Alternatively the blanket layer may be a layer of phosphosilicate glass (PSG), a layer of borophosphosilicate glass (BPSG), a spin-on-glass layer, a silicon oxynitride (SiON) layer, a polyimide layer, silicon nitride layer, a polysilicon layer, a amorphous silicon layer, or a combination thereof. Typically, the thickness of the blanket layer is in a range of approximately 50 to 250 nanometers. The blanket layer is patterned and etched to form the dummy features 16 using conventional processes.

Figure 3:
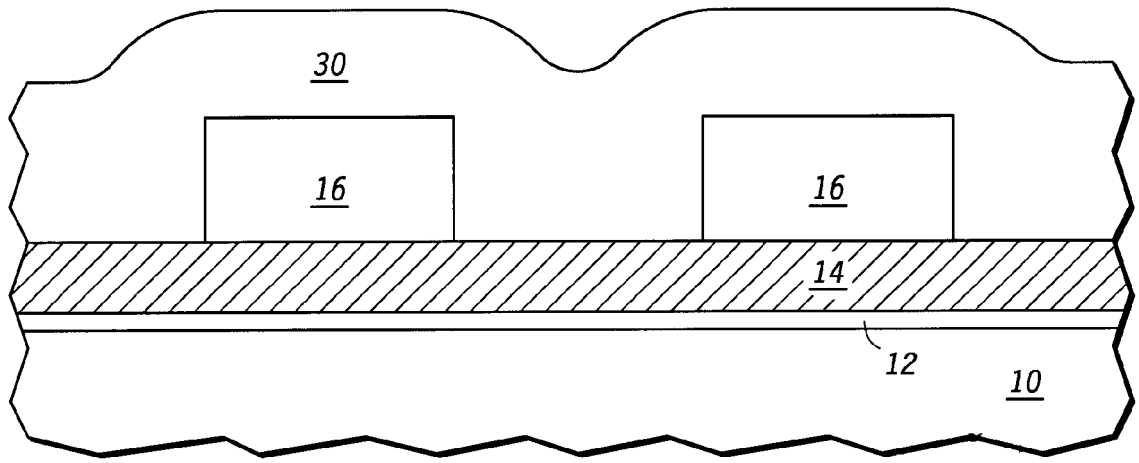
FIG. 3 illustrates a cross-section of the semiconductor device substrate shown in FIG. 1 and further includes a spacer layer formed over the dummy features.
Figure 4:
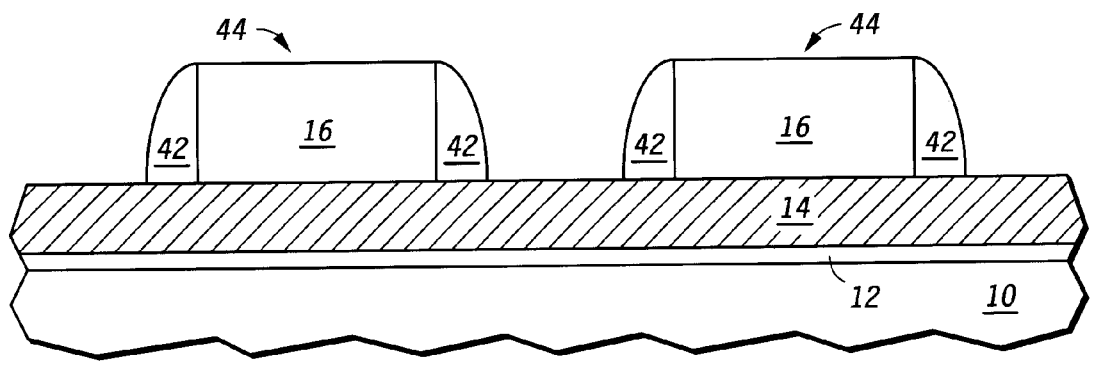
FIGS. 4 and 5 illustrate, respectively, cross-sectional and top-down views of the semiconductor device substrate shown in FIG. 3 after forming spacers adjacent sidewalls of the dummy features.
Figure 5:
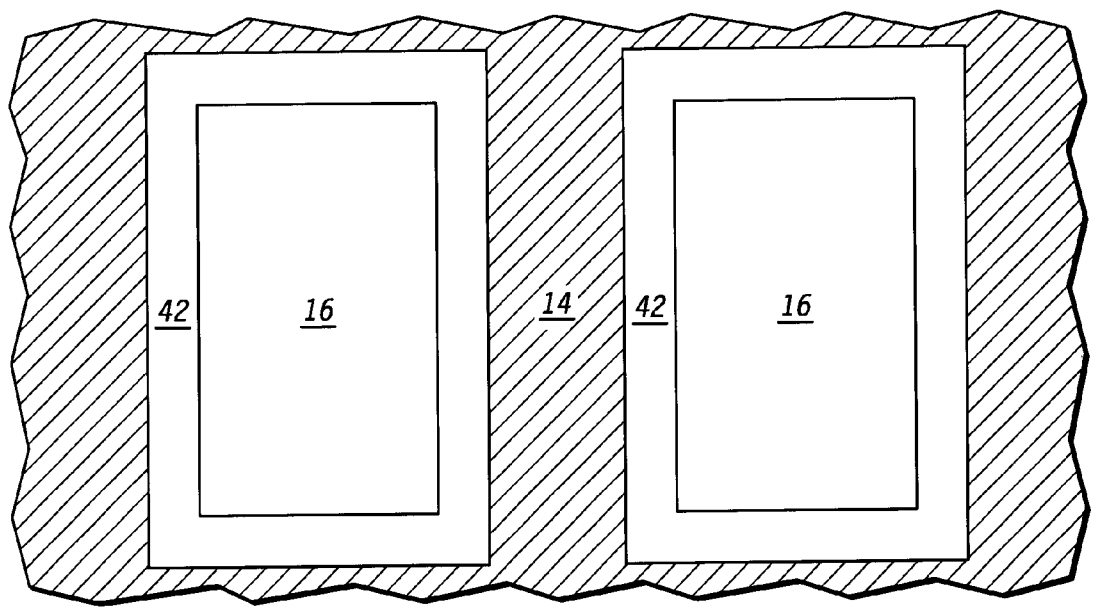

A spacer layer 30 is then formed overlying the conductive layer 14 and the patterned dummy features 16, as shown in FIG. 3. The spacer layer 30 is selected such that it can be selectively etched in subsequent processing steps with respect to the patterned dummy features 16. In accordance with one embodiment, the spacer layer 30 is a layer of chemically vapor deposited silicon nitride. Alternatively the spacer layer 30 can include silicon oxides, polysilicon, amorphous silicon, polyimide, or the like. Typically, the thickness of the spacer layer 30 is in a range of approximately 75 to 200 nanometers. As shown in the cross-section and top-down views of FIGS. 4 and 5, respectively, portions of the spacer layer 30 are then removed using a conventional anisotropic etch process to form the spacers 42 adjacent sidewalls of the patterned dummy features 16.

Figure 6:
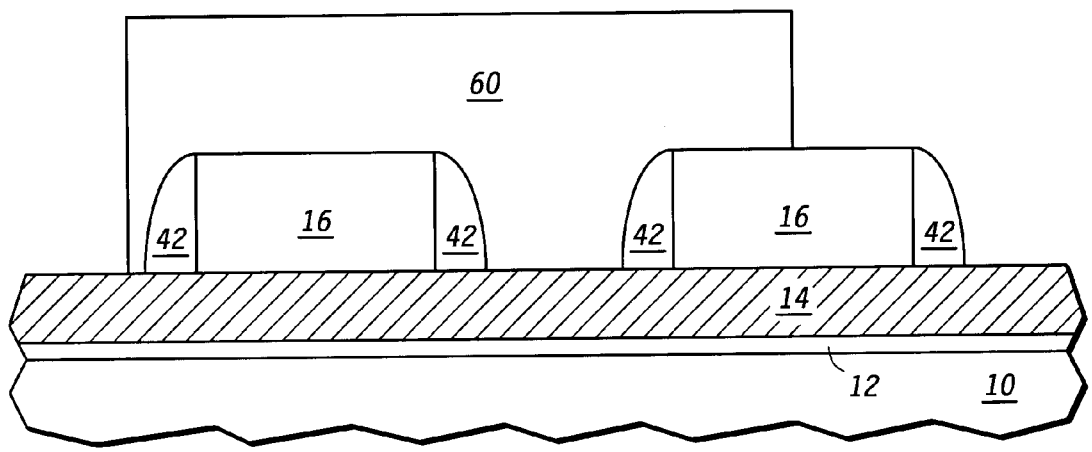
FIGS. 6 and 7 illustrate, respectively, cross-sectional and top-down views of the semiconductor device substrate shown in FIGS. 5–6 after forming a patterned photoresist layer.
Figure 7:
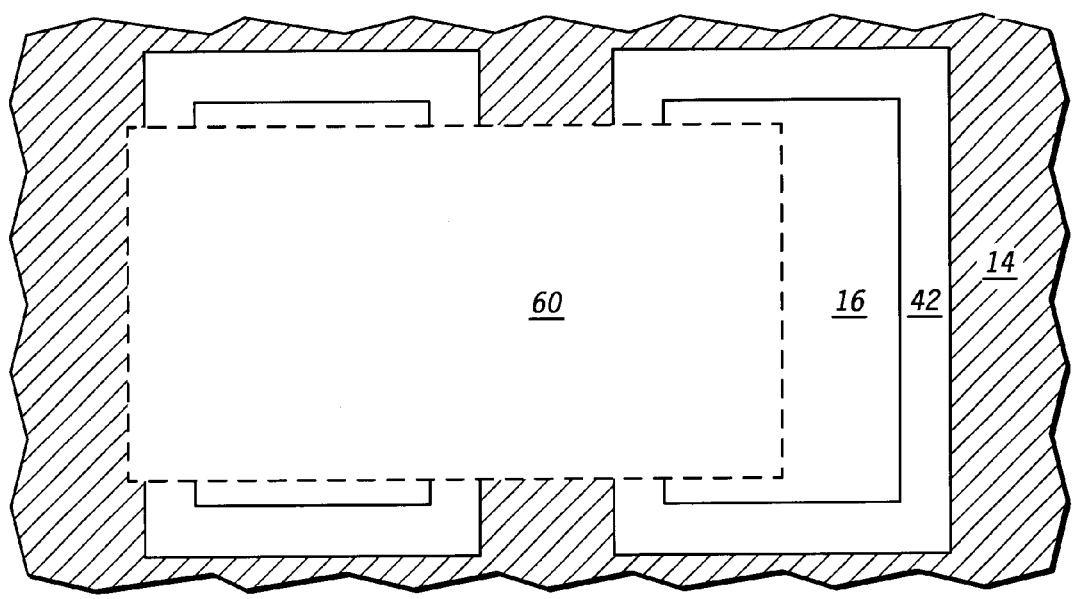
Figure 8:
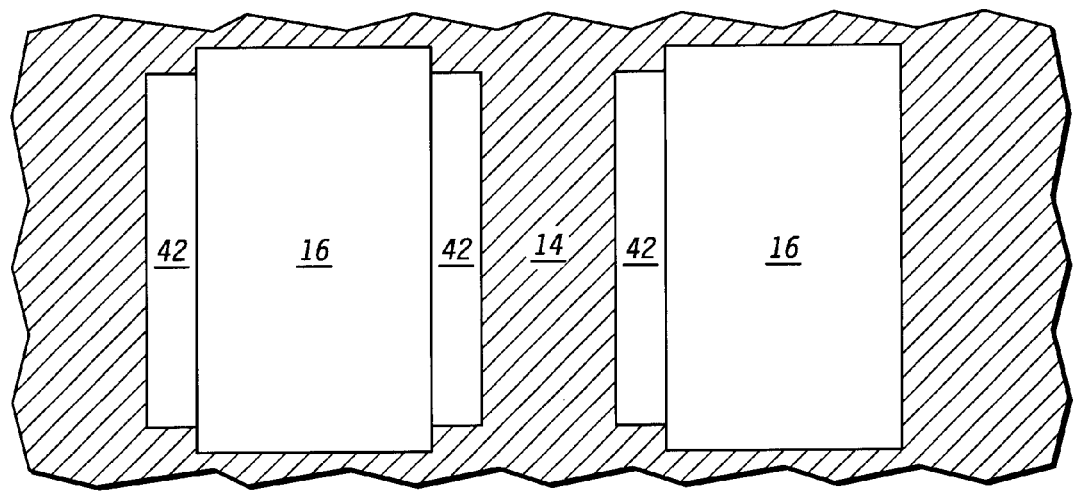
FIG. 8 illustrates a top-down view of the semiconductor device substrate shown in FIG. 7 after performing an etching step and removing the patterned photoresist layer.
Figure 9:
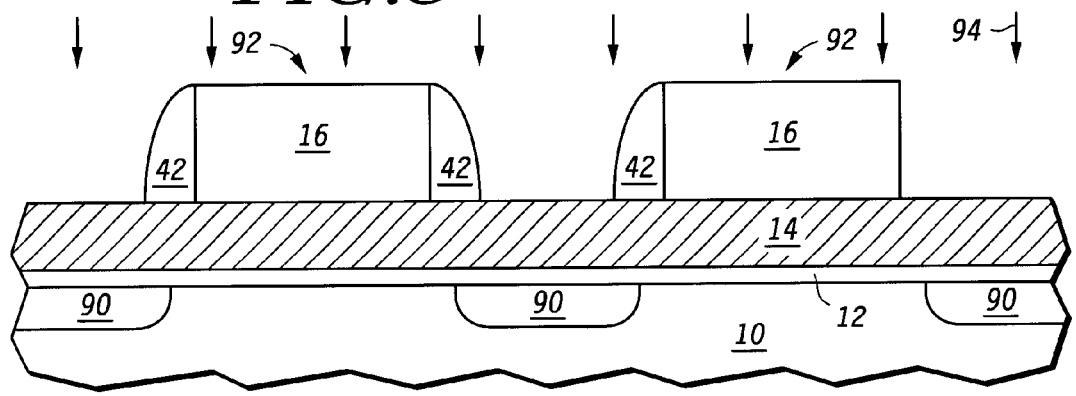
FIG. 9 illustrates a cross-section of the semiconductor device substrate shown in FIG. 8 during an implant to form asymmetrically doped regions.

Included in FIGS. 6 and 7 are cross-section and top-down views, respectively, illustrating that the substrate is then patterned with resist 60 to expose selected regions of the spacers 42 that will subsequently be removed. The exposed selected regions of the spacers 42 are then removed using a conventional plasma or wet nitride etch process. FIGS. 8 and 9 include cross-section and top-down views, respectively, showing that the exposed selected regions of the spacers 42 and the patterned resist layer 60 have been removed. The combination of the remaining spacers 42 and the patterned dummy feature 16 form first patterned features 92 that will subsequently be used to define asymmetrically doped regions within the semiconductor substrate.

FIG. 9 additionally includes arrows 94 that illustrate, in accordance with one embodiment, the substrate is then ion implanted for asymmetry with a second dopant type to form the doped regions 90 within the substrate 10. In accordance with one embodiment, the second dopant type is a same type of dopant as the first dopant type (discussed previously with respect to FIG. 1) and includes p-type dopants, such as boron, indium or the like. Typically, the concentration of the second dopant type in the substrate is greater than the first dopant type and is typically in a range of approximately $5\times10^{16}$ atoms/cm$^3$ to $5\times10^{18}$ atoms/cm$^3$. Therefore, in accordance with one embodiment, the doped regions 90 are regions of the semiconductor substrate implanted for asymmetry and include the same-type albeit a higher concentration of dopants as compared to other regions of the semiconductor substrate. After forming the doped regions 90, if desired, the substrate can then be annealed to laterally diffuse dopant species into channel regions of the substrate 10 (i.e. below the spacers 42, as shown in FIG. 9) to additionally asymmetrically dope the channel regions.

Figure 10:
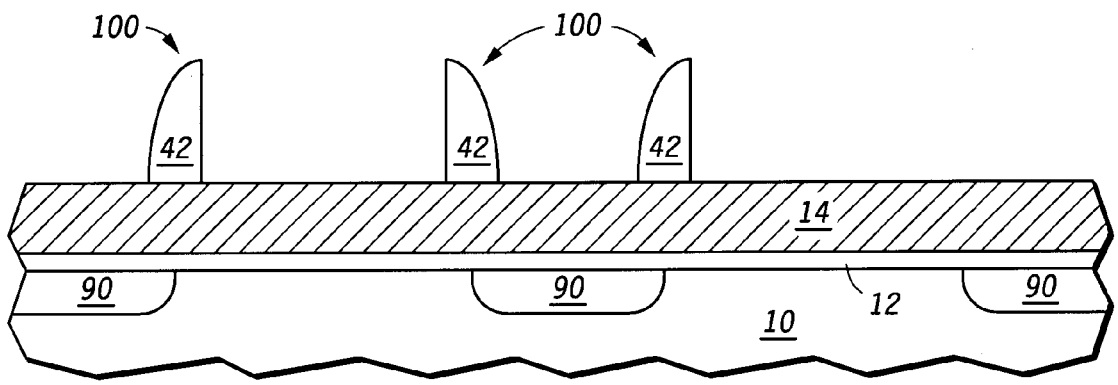
FIGS. 10 and 11 illustrate, respectively, cross-sectional and top-down views of the semiconductor device substrate shown in FIG. 9 after removing the dummy features.
Figure 11:
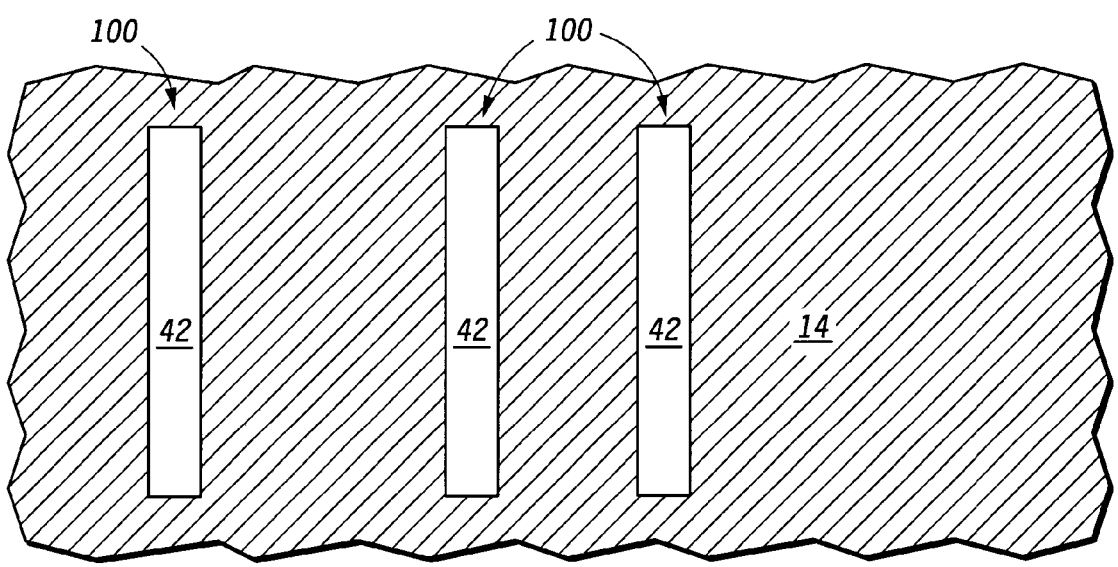
Figure 12:
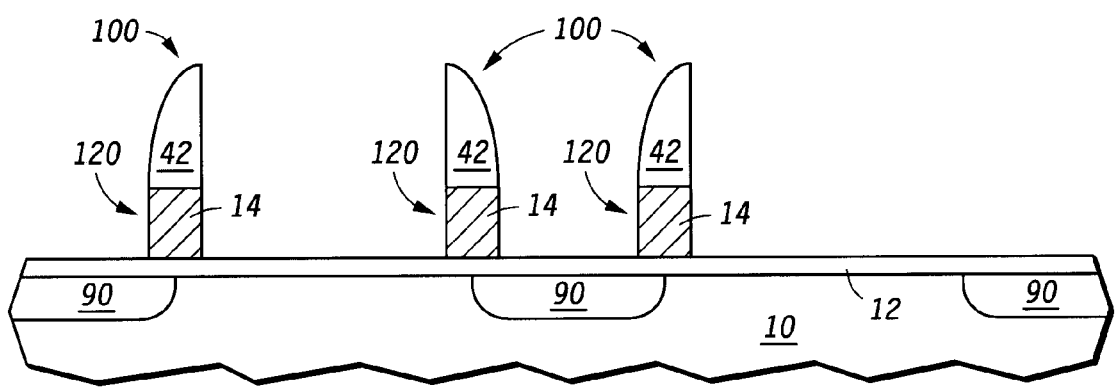
FIG. 12 illustrates a cross-sectional view of the semiconductor device substrate shown in FIG. 10 after forming gate electrodes.
Figure 13:
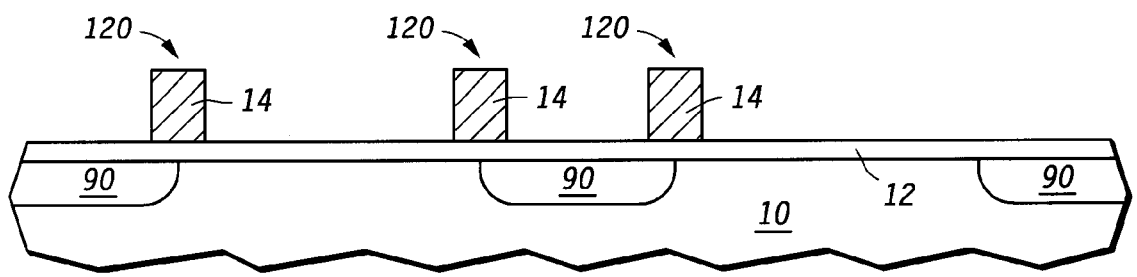
FIGS. 13 and 14 illustrate, respectively, cross-sectional and top-down views of the semiconductor device substrate shown in FIG. 12 after removing the spacer features.
Figure 14:
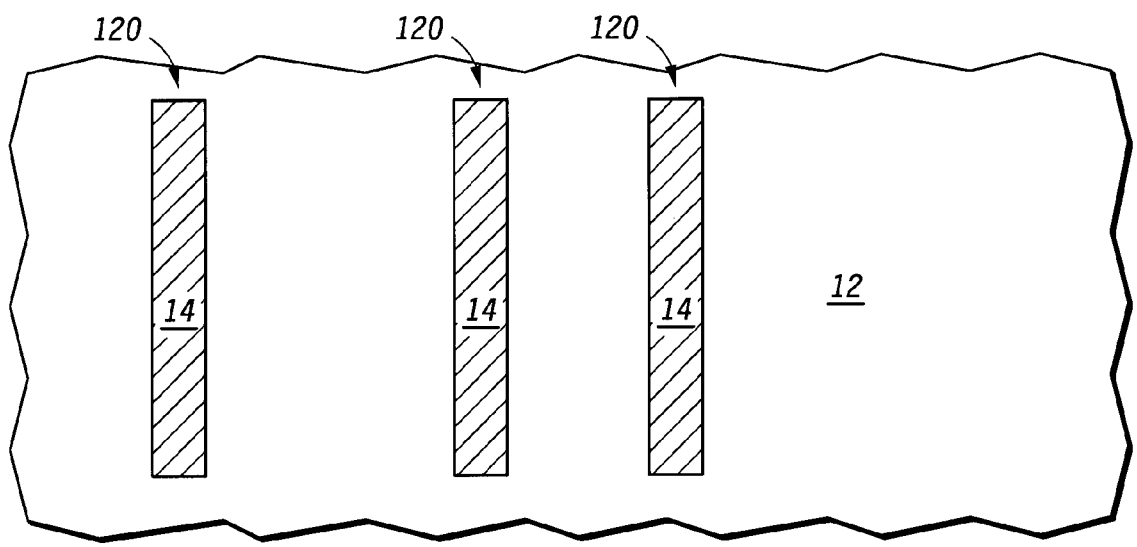

FIGS. 10 and 11 are cross-section and top-down views, respectively, illustrating that the dummy features 16 are then selectively etched with respect to the remaining spacers 42 to form second patterned features 100 overlying the conductive layer 14 from remaining portions of the spacers 42. The second patterned features 100 will subsequently be used as a masking layer during removal of exposed portions of the conductive layer 14. In FIG. 12, the conductive layer 14 is then etched to form gate electrodes 120. This etch can be accomplished using a conventional anisotropic polysilicon etch. Included in FIGS. 13 and 14 are illustrations showing that the second pattern features 100 (i.e. the remaining portions of the spacers 42) are then removed. The removal of the second pattern features 100 can be accomplished using conventional plasma or wet nitride etch processes.

Figure 15:
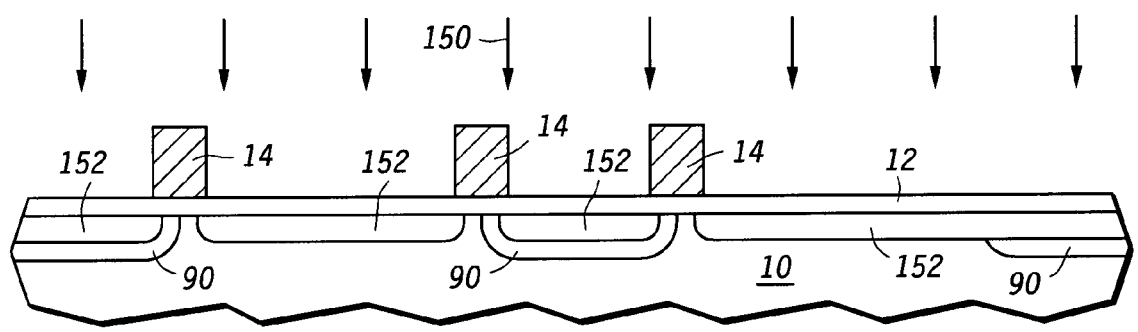
FIG. 15 illustrates a cross-sectional view of the semiconductor device substrate shown in FIG. 13 during an implant to form extension regions.

FIG. 15 illustrates, via arrows 150, that the substrate is then implanted with a third dopant type to form doped regions 152 within the substrate 10. In accordance with one embodiment, the third dopant type includes n-type dopants, such as phosphorus, arsenic, antimony, or the like. The third dopant type is opposite the first and second dopant types (i.e. the first and second type-dopants are p-type dopants and the third type-dopant is an n-type dopant). In accordance with one embodiment, the doped regions 152 form source/drain extension regions for the semiconductor device. One of ordinary skill in the art recognizes that source/drain extension regions are not necessarily a requirement for all semiconductor devices. Typically the concentration of the third dopant type in the semiconductor substrate (for source/drain extension application) is in a range of approximately $5 \times 10^{18}$ atoms/cm$^3$ to $5 \times 10^{21}$ atoms/cm$^3$, and more typically in a range of approximately $1 \times 10^{19}$ atoms/cm$^3$ to $5 \times 10^{20}$ atoms/cm$^3$.

Figure 16:
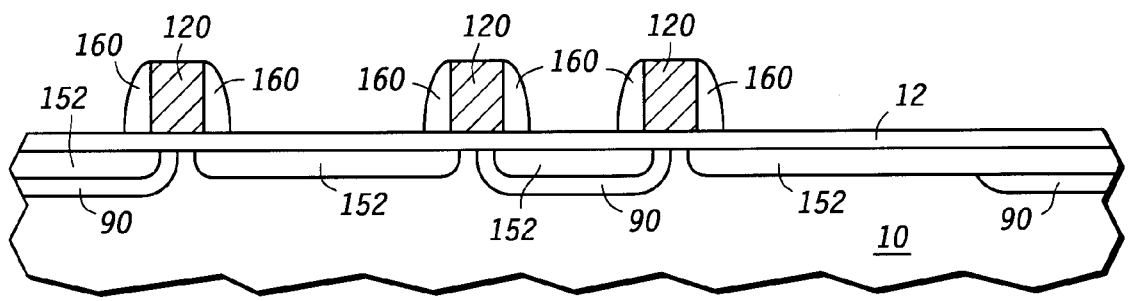
FIG. 16 illustrates a cross-sectional view of the semiconductor device substrate shown in FIG. 15 after forming spacers adjacent the gate electrodes.
Figure 17:
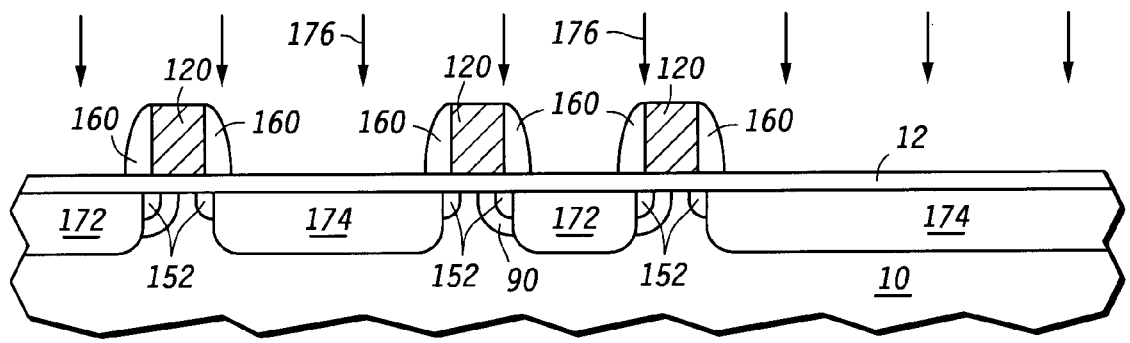
FIG. 17 illustrates a cross-sectional view of the semiconductor device substrate shown in FIG. 16 during an implant to form source/drain regions.

Included in FIG. 16 are dielectric spacers 160 formed adjacent sidewalls of the gate electrodes 120. After the forming the spacers 160, the substrate is then implanted, as illustrated by the arrows 176 in FIG. 17, with a fourth dopant type to form the source regions 172 and drain regions 174 of the semiconductor device. In accordance with one embodiment, the fourth dopant type is a same dopant type as the third dopant type used to form the extension regions 152 (i.e. an n-type dopant, such as phosphorus, arsenic, antimony, or the like). Typically, the dopant concentration of the fourth dopant type in the source regions 172 and the drain region 174 is greater than the dopant concentration of extension regions 152 by approximately one order of magnitude. This concentration is typically in a range of approximately $5 \times 10^{19}$ atoms cm$^3$ to $5 \times 10^{21}$ atoms/cm$^3$ and more typically the concentration is in a range of approximately $1 \times 10^{20}$ atoms/cm$^3$ to $5 \times 10^{20}$ atoms/cm$^3$. If so desired, additional annealing steps can be performed to diffuse dopants within the substrate. As shown in FIG. 17, in accordance with one embodiment, the source regions 172 and their adjacent channel regions are asymmetrically doped with respect to the drain regions 174 and their adjacent channel regions.

Figure 18:
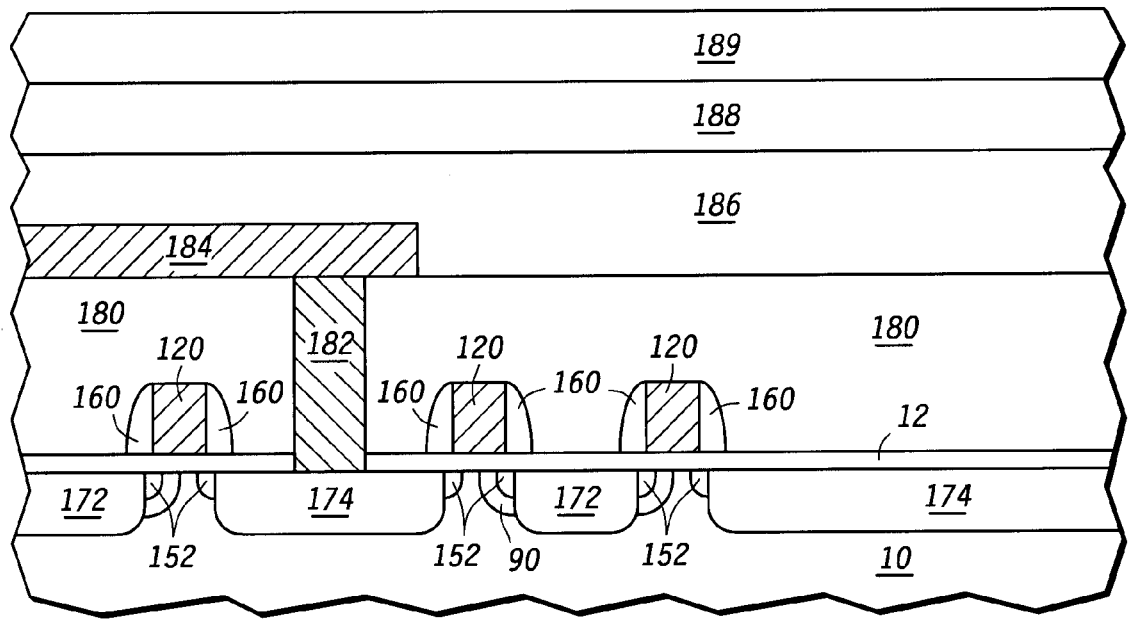
FIG. 18 illustrates a cross-sectional view of the semiconductor device substrate shown in FIG. 17 after forming a substantially completed semiconductor device.

Shown in FIG. 18, an interlevel dielectric (ILD) layer 180 is formed over the substrate and is patterned to a form a contact opening. A conductive plug 182 and interconnect 184 are then formed to make electrical contact to one of the substrate drain regions. A dielectric layer 186, a passivation layer 188, and a polyimide layer 189 are then formed to overlie the uppermost level of interconnects. Although not shown, other electrical connections can be made to gate electrodes and other source or drain regions of the semiconductor device. Additionally, other ILD layers and interconnect levels can be formed as needed to form a more complicated semiconductor device.

Although the embodiments herein describe using implanting to form the doped regions in the semiconductor device, one of ordinary skill in the art recognizes that other methods of doping, such as in-situ doping in a diffusion furnace can also alternatively be used to form the doped regions. In addition, one of ordinary skill in the art recognizes that although the embodiments described that the first and second dopant types include p-type dopants and the third and fourth dopant types include n-type dopants, the doping scheme to form the semiconductor device can be alternated, if so desired, such that the first and second dopant types include n-type dopants and the third and fourth dopant types include p-type dopants.

In addition, while the previously embodiments have been used to describe a method in which the substrate doping and the implant for asymmetry include a same-type dopant. Variations are possible. In an alternative embodiment, the implant for asymmetry can include a dopant type opposite the substrate dopant type, thereby forming the asymmetrically doped semiconductor device via a counter doping scheme. For example, in this embodiment, a conductive layer similar to the conductive layer 14 in FIG. 1 is formed over a semiconductor substrate, wherein the semiconductor substrate includes a first dopant type at a first concentration. Then, dummy features and spacers are formed over the conductive layer to form first patterned features, similar to the dummy features 16, spacers 42, and first patterned features 92 shown in FIG. 9. The substrate is then implanted for asymmetry as shown in FIG. 9, however, in accordance with this embodiment, the implant counter dopes the substrate with a second dopant type that is opposite the first dopant type. The net effect of the counter doping is to form asymmetrically doped regions in the substrate, wherein the concentration of the first dopant type in the asymmetric regions is less than other areas of the substrate. Then, as shown in FIG. 10, the dummy feature is removed to form a second patterned feature similar to the second patterned feature 100, and the conductive layer is etched to form gate electrodes similar to the gate electrodes 120 shown in FIG. 12. Then, the second patterned feature is removed and the substrate is implanted with third and fourth dopant types to form the extension regions (if so desired) and source and drain regions, respectively, similar to the extension regions 152 and source and drain regions 172 and 174 in FIGS. 15–17. In accordance with this embodiment, the third and fourth dopant type includes a dopant type that is the same as the second dopant type and opposite the first dopant type. The overall effect, however, is to produce a semiconductor device having an asymmetrically doped source and drain regions.

Therefore, the embodiments described herein include a method for forming an asymmetric MOSFET that has advantages over its double-halo and conventional MOSFET counterparts. These advantages include an ability to produce higher drive current and higher transconductance, which translate into increased semiconductor device speed and improved overall device performance. The embodiments of the present invention additionally have an advantage in that they can be performed without having to develop new or complicated films, patterning, or etch processes and they can be extended for use in manufacturing a wide variety of semiconductor device types. Furthermore, the embodiments described herein do not require using a combination of critical patterning and implanting processes or using implant techniques that require the use of restrictive layout as required by the prior art.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for forming a semiconductor device comprising:
    forming a dielectric layer over a semiconductor substrate, wherein the semiconductor substrate includes a first dopant type;
    forming a conductive layer over the dielectric layer;
    forming a dummy layer over the conductive layer;
    removing portions of the dummy layer to form a dummy feature having a sidewall;
    forming a first spacer adjacent the sidewall, wherein the dummy feature and the first spacer are formed from different materials and a combination of the dummy feature and the first spacer forms a first patterned feature;
    doping a first region of the semiconductor substrate adjacent the first patterned feature with a second dopant type, wherein the first dopant type and the second dopant type are from a same family of dopant types;
    removing the dummy feature from the first patterned feature to define a second patterned feature;
    removing portions of the conductive layer that are not masked by the second patterned feature to form a gate electrode;
    removing a remaining portion of the first spacer; and
    doping a second region of the semiconductor substrate with a third dopant type to form source/drain regions adjacent the gate electrode, wherein the third dopant type includes dopants from a family of dopant types that is opposite the first dopant type and the second dopant type, and wherein a concentration of dopant species in a source region and a concentration of dopant species in a drain region are a different concentration.

2. The method of claim 1 further comprising:
    doping a third region of the semiconductor substrate with a fourth dopant type to form extension regions; and
    forming spacers adjacent the gate electrode after doping the third region and prior to doping portions of the semiconductor substrate with a third dopant type to form source/drain regions, wherein the fourth dopant type and the third dopant type are from a same family of dopant types.

3. The method of claim 1 further comprising diffusing an amount of the second dopant type into a channel region of the semiconductor substrate below the gate electrode.

4. A method for forming a semiconductor device comprising:
    forming a conductive layer over a semiconductor substrate, wherein the semiconductor substrate includes a first dopant type;
    forming a dummy layer over the conductive layer;
    removing portions of the dummy layer to form a dummy feature;
    forming a first spacer, wherein a combination of the first spacer and the dummy feature forms a first patterned feature;
    removing the dummy feature from the first patterned feature to form a second patterned feature;
    doping a first region of the semiconductor substrate with a second dopant type before removing the dummy feature;
    removing portions of the conductive layer that are not masked by the second patterned feature to form a gate electrode;
    removing a remaining portion of the first spacer;
    forming a second spacer adjacent the gate electrode;
    doping a second region of the semiconductor substrate adjacent the gate electrode with a third dopant type before forming a second spacer; and
    doping a third region of the semiconductor substrate adjacent the second spacer with a fourth dopant type after forming a second spacer.

5. The method of claim 4 wherein:
    the dummy feature having a sidewall wherein the first spacer is adjacent the sidewall;
    the first region is exposed by the first patterned feature; and
    the second dopant type includes dopants from a same family of dopants as the first dopant type.

6. The method of claim 5, wherein the third dopant type includes dopants from a family-of dopants that is opposite the first dopant type and the second dopant type.

7. The method of claim 6, wherein the fourth dopant type includes dopants from a family of dopants that is opposite the first dopant type and the second dopant type.

8. The method of claim 7, wherein:
    a concentration of the first dopant type is in a range of approximately $5 \times 10^{15}$ atoms/cm$^3$ to $5 \times 10^{18}$ atoms/cm$^3$;
    a concentration of the second dopant type is greater than the concentration of the first dopant type and in a range of approximately $5 \times 10^{16}$ atoms/cm$^3$ to $5 \times 10^{18}$ atoms/cm$^3$;
    a concentration of the third dopant type is in a range of approximately $5 \times 10^{15}$ atoms/cm$^3$ to $5 \times 10^{21}$ atoms/cm$^3$; and
    a concentration of the fourth dopant type is greater than the concentration of the third dopant type and in a range of approximately $5 \times 10^{19}$ atoms/cm$^3$ to $5 \times 10^{21}$ atoms/cm$^3$.

9. The method of claim 8 further comprising:
    forming a dielectric layer over the semiconductor substrate after forming the gate electrode;
    forming an interconnect layer over the dielectric layer; and
    forming a passivation layer over the interconnect layer.

10. The method of claim 8, wherein at least one of doping a first region, doping a second region, and doping a third region includes using ion implantation.

11. The method of claim 5, wherein the conductive layer includes a material selected from a group consisting of a metal-containing material and a silicon-containing material.

12. The method of claim 5, wherein the dummy layer includes materials selected from the group consisting of an oxide, a nitride, polysilicon, amorphous silicon, and polyimide.

13. The method of claim 5, wherein the first spacer includes materials selected from the group consisting of a nitride, an oxide, polysilicon, amorphous silicon, and polyimide.

14. The method of claim 5, wherein the conductive layer, the dummy layer, and the first spacer are formed using different materials.

15. The method of claim 5, further comprising forming a gate dielectric between the semiconductor substrate and the gate electrode.

16. The method of claim 5, further comprising diffusing an amount of the second dopant type into a region of the semiconductor substrate below the gate electrode.

17. The method of claim 4, wherein:

the first dopant type has a first concentration;

the first dopant type and the second dopant type are from an opposite family of dopant types; and a concentration of the first dopant type in a region adjacent the dummy feature is less than the first concentration;

and the method further comprising:

removing remaining portions of the first spacer; and doping a second region of the semiconductor substrate adjacent the gate electrode with a third dopant type, wherein the third dopant type and the second dopant type include dopants from a same family of dopant types.

18. The method of claim 17, further comprising:

forming second spacers adjacent the gate electrode; and doping a third region of the semiconductor substrate adjacent the second spacers with a fourth dopant type, wherein the fourth dopant type and the third dopant type include dopants from a same family of dopant types, and wherein a concentration of the third dopant type in the semiconductor substrate is less than a concentration of the fourth dopant type in the semiconductor substrate.

19. The method of claim 18, wherein at least one of doping the first region, doping the second region, and doping the third region includes using ion implantation.

20. The method of claim 17, wherein the conductive layer includes a material selected from a group consisting of a metal-containing material and a silicon-containing material.

21. The method of claim 17, wherein the dummy layer includes materials selected from the group consisting of an oxide, a nitride, polysilicon, amorphous silicon, and polyimide.

22. The method of claim 17, wherein the first spacers include materials selected from the group consisting of a nitride, an oxide, polysilicon, amorphous silicon, and polyimide.

23. The method of claim 17 further comprising diffusing an amount of the second dopant type into a fourth region of the semiconductor substrate below the gate electrode.

24. A method for forming a semiconductor device comprising:

forming a dielectric layer over a semiconductor substrate, wherein the semiconductor substrate includes a first dopant type;

forming a conductive layer over the dielectric layer;

forming a dummy layer over the conductive layer;

removing portions of the dummy layer to form a dummy feature having a sidewall;

forming a first spacer adjacent the sidewall, wherein the dummy feature and the first spacer are formed from different materials and a combination of the dummy feature and the first spacer forms a first patterned feature;

doping a first region of the semiconductor substrate adjacent the first patterned feature with a second dopant type, wherein the first dopant type and the second dopant type are from a same family of dopant types;

removing the dummy feature from the first patterned feature to define a second patterned feature;

removing portions of the conductive layer that are not masked by the second patterned feature to form a gate electrode;

removing a remaining portion of the first spacer;

doping a second region of the semiconductor substrate with a third dopant type to form source/drain regions adjacent the gate electrode, wherein the third dopant type includes dopants from a family of dopant types that is opposite the first dopant type and the second dopant type, and wherein a concentration of dopant species in a source region and a concentration of dopant species in a drain region are a different concentration; and doping a third region of the semiconductor substrate with a fourth dopant type to form extension regions; and forming spacers adjacent the gate electrode after doping the third region and prior to doping portions of the semiconductor substrate with a third dopant type to form source/drain regions, wherein the fourth dopant type and the third dopant type are from a same family of dopant types.

* * * * *

UNITED STATES PATENT AND TRADEMARK OFFICE
CERTIFICATE OF CORRECTION

PATENT NO. : 6,362,057 B1
DATED : March 26, 2002
INVENTOR(S) : William J. Taylor et al.

It is certified that error appears in the above-identified patent and that said Letters Patent is hereby corrected as shown below:

Column 8,
Line 32, change "$5x10^{15}$" to -- $5x10^{18}$ --

Signed and Sealed this

Twenty-eighth Day of January, 2003

JAMES E. ROGAN
*Director of the United States Patent and Trademark Office*